United States Patent [19]
Lostumo et al.

[11] Patent Number: 5,847,933
[45] Date of Patent: Dec. 8, 1998

[54] SOLDERLESS FOCUS MODULE

[75] Inventors: Arthur J. Lostumo, Franklin Park; Steven J. Pulchinski, Rolling Meadows, both of Ill.

[73] Assignee: Zenith Electronics Corporation, Glenview, Ill.

[21] Appl. No.: 795,505

[22] Filed: Feb. 5, 1997

[51] Int. Cl.$^6$ ............................... H05K 5/00; H01R 4/24
[52] U.S. Cl. .................... 301/752; 361/728; 361/836; 174/250; 439/387
[58] Field of Search ..................... 361/728, 729, 361/736, 752, 836; 439/86, 91, 387; 174/250, 251; 29/610.1, 621

[56] References Cited

U.S. PATENT DOCUMENTS

| | | | |
|---|---|---|---|
| 3,846,731 | 11/1974 | Dumas et al. | 338/127 |
| 5,006,286 | 4/1991 | Dery et al. | 439/86 X |
| 5,412,159 | 5/1995 | Witgen et al. | 174/250 |

FOREIGN PATENT DOCUMENTS

| | | | |
|---|---|---|---|
| 3311651 | 10/1984 | Germany | 439/86 |

*Primary Examiner*—Leo P. Picard
*Assistant Examiner*—Jayprakash N. Gandhi

[57] ABSTRACT

A high voltage focus potentiometer module includes a housing having a plurality of connection cavities and corresponding wire guides formed therein. A substrate is secured within the housing. The substrate includes the stationary elements of the potentiometer, the wiper of which is located in a recess that is surrounded by a flexible seal. Conductive rubber inserts are loosely fitted in the cavities and are adapted to be piercingly engaged by wires in the wire guides and in contact with corresponding conductive pads on the substrate. Channels are provided in the housing to permit flowable epoxy to surround the conductive rubber inserts and wires in the cavities. A high voltage transformer includes a shell having an open side to which the potentiometer module is snap-fitted. A conductive element on the transformer is positioned in the open side and is adapted to be piercingly engaged by a conductive rubber plug that also engages a conductive pad on the other side of the substrate. The entire assembly is potted.

11 Claims, 2 Drawing Sheets

SOLDERLESS FOCUS MODULE

BACKGROUND OF THE INVENTION AND PRIOR ART

This invention relates to high voltage transformer arrangements for cathode ray tube display systems and specifically to a novel potted focus module and transformer assembly.

It is well known, as evidenced by U.S. Pat. No. 5,412,159, in the names of the inventors and assigned to Zenith Electronics Corporation, to fabricate a focus modulate in which a housing supports a substrate that carries electrical componentry, for example, resistive and conductive elements, solder pads and the stationary elements of one or more potentiometers. The substrate is made of alumina and the electrical elements are formed by screening of the appropriate materials in desired patterns on both sides thereof. The screened substrate is fired to affix the electrical elements and subsequently assembled into the housing. A flexible seal surrounds a recess in the housing in which the wipers of the potentiometers operate. The seal assures that the potentiometer is protected from the potting compound that subsequently fills the housing. Prior to assembly, wires are soldered to the solder pads and a female connector is soldered to the solder pad, on the other side of the substrate, that connects to the high voltage transformer. The connecting wires or leads are confined by corresponding wire guides in the housing. The housing is snap-fitted onto the open side of a shell that houses the high voltage transformer, with the female connector of the focus module mechanically engaging a male connector on the transformer. The entire assembly is then potted.

The present invention modifies the construction of the structure of the above patent by replacing the solder connections and the female connector with conductive rubber inserts and a conductive rubber plug, respectively.

OBJECTS OF THE INVENTION

A principal object of the invention is to provide a novel method and apparatus for a focus module.

Another object of the invention is to provide a focus module that does not require soldering.

A further object of the invention is to provide a novel combination potted high voltage transformer and focus module assembly.

BRIEF DESCRIPTION OF THE DRAWINGS

These and other objects and advantages of the invention will be apparent upon reading the following description thereof in conjunction with the drawings, in which.

DESCRIPTION OF THE PREFERRED EMBODIMENT

Figure 4:
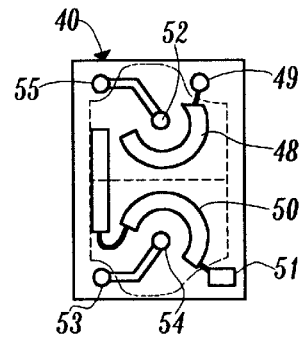
Figure 1:
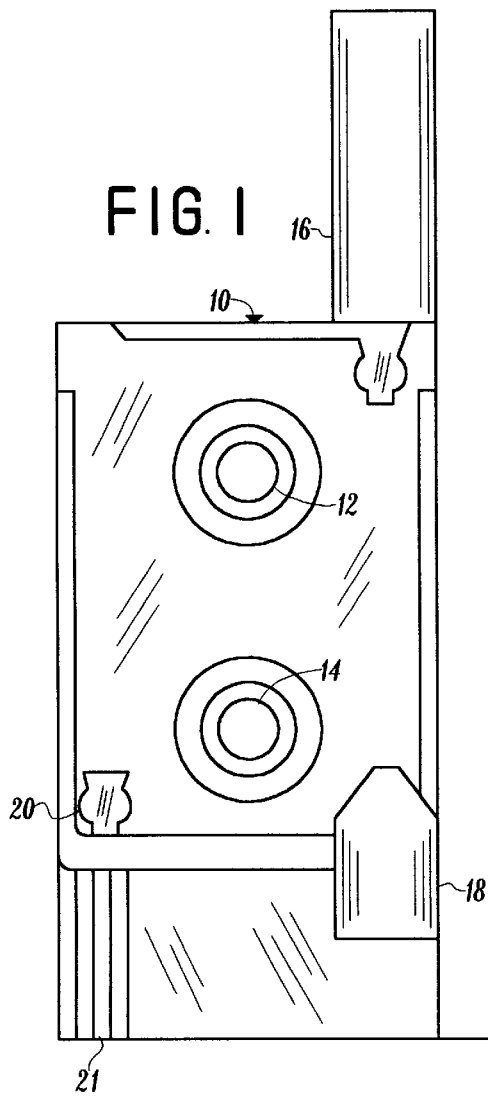
FIG. 1 is a front view of the focus module housing of the invention.
Figure 2:
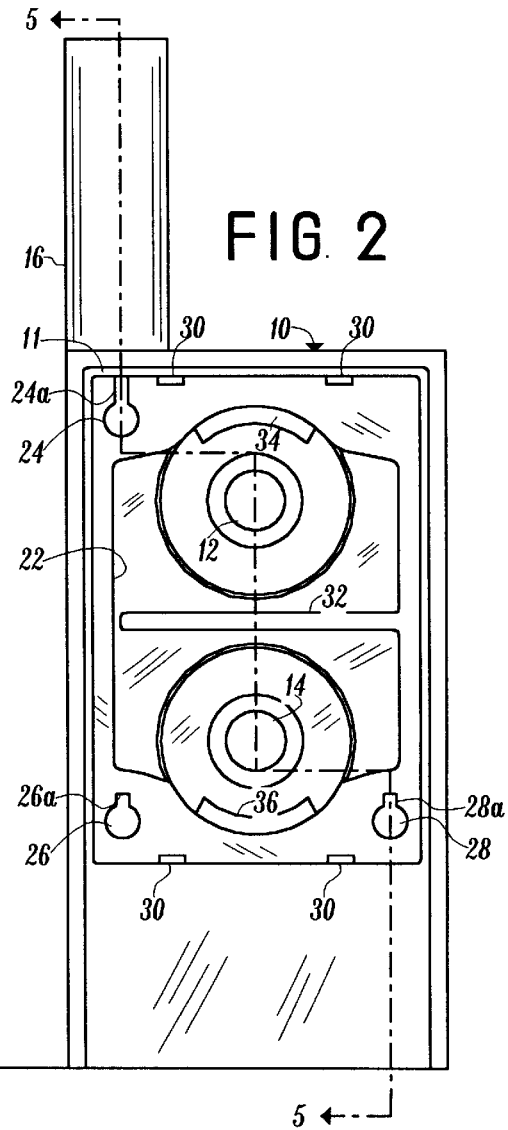
FIG. 2 is a rear view of the housing.
Figure 5:
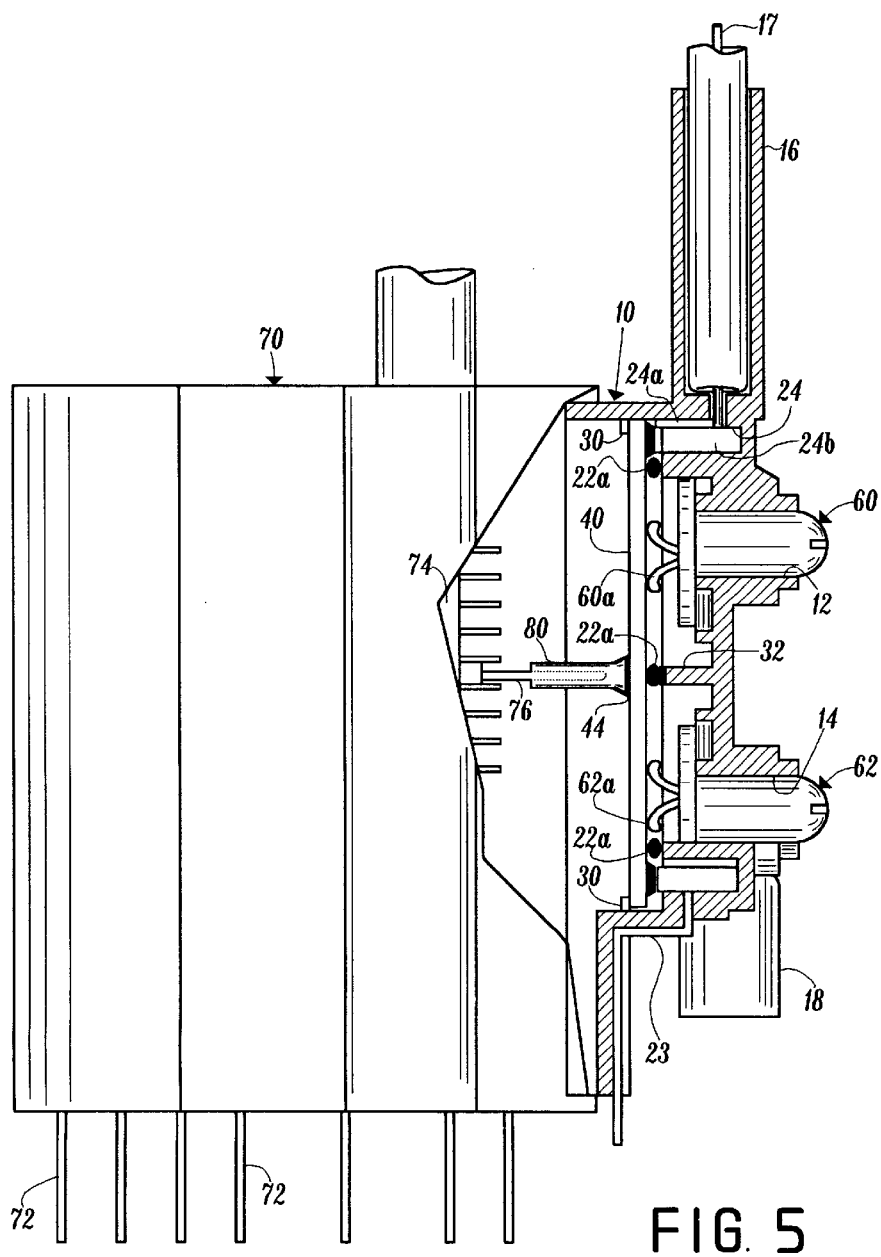
FIG. 5 is a view of the assembled high voltage transformer and focus module, with the focus module being sectioned along the line 5—5 of FIG. 2.

Referring to FIGS. 1 and 2, housing 10, which is made of a suitable plastic material, includes a pair of orifices 12 and 14 for providing access to the shafts of a pair of potentiometers 60 and 62 (FIG. 5). A pair of tubular wire guides 16 and 18 and a ground connection site 20 are formed in the housing. A recess 22 is formed in the underside of housing 10 for containing the wipers of the potentiometers. A plurality of connection cavities 24, 26 and 28, including flow channels 24a, 26a and 28a, respectively, are in communication with wire guides 16 and 18 and ground connection site 20, respectively, by means of suitable apertures in the walls of housing 10. A groove 21 is formed in housing 10 for supporting a contoured conductive ground strap 23 (FIG. 5) that communicates with an orifice in ground connection site 20. A plurality of tabs 30 are positioned around the inner wall of housing 10 for securing a substrate 40 (FIGS. 3 and 4) in housing 10. A partition wall 32 divides recess 22 and assists in supporting the substrate in the housing. A pair of stops 34 and 36 are located in recess 22 for limiting the rotational movement of the shafts of potentiometers 60 and 62, respectively.

Figure 3:
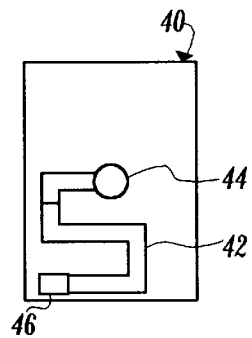
FIGS. 3 and 4 are views of the two sides of the substrate used in the invention.

As seen in FIGS. 3 and 4, substrate 40 has formed thereon electronic componentry, including resistive elements 42, 43, various conductive pads 44, 46, 49, 51, 53 and 55 and the stationary resistive elements 48, 50 and wiper pads 52, 54 of potentiometers 60 and 62 (FIG. 5). On the double-sided substrate, conductive pads 46 and 51 are electrically connected together via a plated-through hole in the substrate. As is known to those skilled in the art, a conductive wiper 60a makes a rotating electrical contact with wiper pad 52 and a slidable electrical contact with stationary resistive element 48 in potentiometer 60. Similarly, potentiometer 62 includes a wiper 62a contacting wiper pad 54 and stationary resistive element 50.

Referring to FIG. 5, a partially broken away view of a high voltage transformer case 70, that encloses a high voltage transformer 74, is shown along with a sectioned view of the assembled focus module. The transformer case has an open side to which the housing of the focus module is secured by means of a snap-fit between the walls of the transformer case and the walls of the focus module housing. The transformer has a number of connection leads 72 for connecting the transformer to other circuitry (not shown). An outwardly extending conductor 76 from transformer 74 is illustrated in piercing engagement with a conductive rubber plug 80 that has a base that is in contact with conductive pad 44 on the substrate. The transformer and focus module assembly has a generally open bottom to permit entry of a flowable epoxy or potting compound to the entire arrangement to eliminate air pockets and to provide a hermetically sealed assembly. The potting compound or flowable epoxy is, of course, hardenable and when "set" or cured, functions to secure the transformer and focus module to each other. The positions of wipers 60a and 62a of potentiometers 60 and 62, respectively, with respect to the substrate 40, are also shown. It will be noted that a flexible seal 22a is interposed between the substrate and the periphery of recess 22 and partition 32. The purpose of the seal is to protect the potentiometers (stationary resistive elements, wipers and shafts) from contact with the potting compound or epoxy. The seal may comprise a bead of silicone material or the like that is deposited by automated means, not shown, before substrate 40 is assembled to housing 10.

Figure 6:
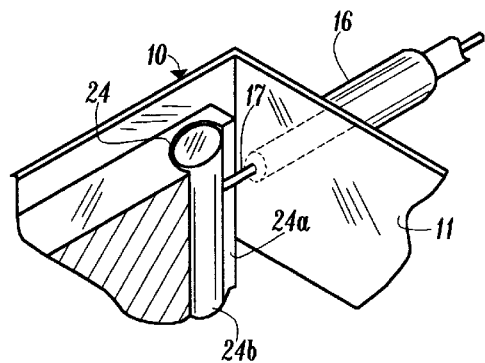
FIG. 6 is a partial, broken away view of one of the connection cavities in the housing with the conductive rubber insert and wire in place.

Referring additionally to FIG. 6, a cylindrical conductive rubber insert is installed in each connection cavity. Thus a conductive rubber insert 24b is installed in cavity 24 and a conductive rubber insert 28b is installed in cavity 28. (The conductive rubber insert installed in cavity 26 is not visible in any of the figures.) The diameters of the inserts are less than the diameters of the cavities, thus making the inserts a loose fit in the cavities. Their lengths are such that the conductive rubber inserts are compressed slightly when the substrate is installed in the housing to assure good contact with the conductive pads.

During installation in housing 10, substrate 40 is held (by any well known means) in compressive engagement with: wipers 60a and 62a, seal 22a, and conductive rubber inserts 24b, 26b and 28b. The tabs 30 are preferably formed from walls 11 of housing 10 by heat staking to maintain substrate 40 in position in housing 10. It will be seen that flow channels 24a, 26a and 28a provide passages for the flowable epoxy, or other potting compound, to access connection cavities 24, 26 and 28.

As best seen in FIG. 6, a stripped, insulated conductor 17 is inserted into wire guide 16, through the opening in wall 11 and into piercing engagement with conductive rubber insert 24b in connection cavity 24. Since the insert is a loose fit (diameter-wise) in the cavity, it may be readily surrounded (except for its ends) by the flowable epoxy or potting compound. The portion of conductor 17 that is exposed in channel 24a and in cavity 24 is also surrounded by the epoxy, some of which also flows through the orifice and into the wire guide. When the epoxy or potting compound "sets", both the conductive rubber insert and the wire are securely held in the cavity. In similar fashion, the other wire and the ground strap are secured in electrical engagement with the conductive inserts in the other cavity and at the ground connection site, respectively.

As mentioned, the epoxy or potting compound is applied after the focus module is assembled to transformer shell 70 and conductive rubber plug 80 has been impaled upon outwardly extending conductor 76 and brought into contact with conductive pad 44 on substrate 40. The epoxy surrounds the conductive rubber plug and secures everything when it hardens.

What has been described is a novel focus module and method of manufacture that requires no soldering. Also described is the combination of such a focus module and a high voltage transformer. It is recognized that numerous modifications in the described embodiment of the invention will occur to those skilled in the art without departing from its true spirit and scope. The invention is to be limited only as defined in the claims.

What is claimed is:

1. A solderless electrical module comprising:
   a substrate including electrical componentry and a conductive pad thereon;
   a housing having a connection cavity and a communicating wire guide formed therein;
   a conductive rubber insert adapted to loosely fit in said cavity;
   a wire;
   means for installing said substrate in said housing with said wire positioned in said wire guide and in piercing engagement with said conductive rubber insert in said cavity; and
   means for securing said conductive rubber insert and said wire in said cavity.

2. The module of claim 1, wherein said securing means comprises a flowable epoxy.

3. The module of claim 2, further comprising:
   a potentiometer having a movable shaft, a wiper coupled thereto and stationary elements;
   said stationary elements being included in said electrical componentry on said substrate;
   said housing including an orifice for providing access to said movable shaft and a recess for said movable shaft and wiper, said wiper electrically contacting said stationary elements; and
   means for protecting said potentiometer from contact with said epoxy.

4. The module of claim 3, further including:
   channels formed in said housing in communication with said cavities for enabling the introduction of said epoxy to said cavities; and
   seal means surrounding said recess for preventing said epoxy from contacting said potentiometer.

5. A solderless focus potentiometer, including a movable shaft, a wiper coupled to said shaft and stationary elements, comprising:
   a substrate having said stationary elements and a conductive pad formed thereon;
   a housing including an orifice for said shaft, a connection cavity and a wire guide in communication with said connection cavity;
   a conductive rubber insert adapted to loosely fit in said cavity;
   a wire in said wire guide in piercing engagement with said conductive rubber insert in said cavity;
   a recess formed in said housing for containing said wiper;
   means for securing said substrate in said housing; and
   means for securing said conductive rubber insert and said wire in said cavity.

6. The module of claim 5, wherein said conductive rubber insert and said wire are secured in said cavity with a flowable epoxy and further comprising:
   a channel in said housing in communication with said cavity for enabling said flowable epoxy in said cavity to surround said conductive rubber insert and said wire.

7. The module of claim 6, wherein said substrate is secured to said housing by means of a plurality of heat-staked tabs formed from said housing.

8. The module of claim 7, further including seal means around said recess to prevent said epoxy from contacting said potentiometer.

9. A combination high voltage transformer and focus potentiometer assembly comprising:
   a high voltage transformer including a shell having an open side;
   an outwardly extending conductive element on said transformer positioned in said open side;
   a conductive rubber plug impaled on said conductive element;
   a focus potentiometer including a housing having a cavity;
   a substrate secured in said cavity and including stationary elements of said potentiometer on one side of said substrate;
   a high voltage conductive pad on the other side of said substrate; and
   means for snap-fitting said housing to said open side of said shell with the base of said rubber plug engaging said high voltage conductive pad.

10. The combination of claim 9, wherein said shell and said housing are filled with an epoxy.

11. The combination of claim 10, wherein said housing includes:

wire guides;

connection cavities in communication with respective ones of said wire guides; and epoxy flow channels accessing said connection cavities;

said substrate including conductive pads juxtaposed to said connection cavities;

conductive rubber plugs loosely fitted in said connection cavities, said plugs adapted to be in contact with said conductive pads and piercingly engaged by wires in said wire guides; and means for sealing said stationary elements on said substrate from contact with said epoxy.

\* \* \* \* \*